(12) United States Patent
Iravani

(10) Patent No.: US 6,353,368 B1
(45) Date of Patent: Mar. 5, 2002

(54) VCO CIRCUIT USING NEGATIVE FEEDBACK TO REDUCE PHASE NOISE

(75) Inventor: Kamran Iravani, San Jose, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/437,576

(22) Filed: Nov. 9, 1999

(51) Int. Cl.$^7$ .................. H03B 5/24; H03L 7/06
(52) U.S. Cl. .................. 331/57; 331/8; 331/17; 331/1 R; 331/1 A; 331/25; 331/34; 327/39; 327/155
(58) Field of Search .................. 331/1 A, 8, 16, 331/17, 18, 1 R, 25, 34, 177 A; 327/155–159, 39, 40, 47, 49

(56) References Cited

U.S. PATENT DOCUMENTS

| | | | | |
|---|---|---|---|---|
| 3,328,710 A | * | 6/1967 | Baldwin | 329/315 |
| 3,573,650 A | * | 4/1971 | Maltese | 331/1 R X |
| 4,520,327 A | * | 5/1985 | Myers | 331/177 R |
| 4,644,296 A | * | 2/1987 | Crossley et al. | 331/1 R |
| 4,975,653 A | * | 12/1990 | Kennedy et al. | 329/318 |
| 5,015,970 A | * | 5/1991 | Williams et al. | 331/11 |
| 5,061,907 A | * | 10/1991 | Rasmussen | 331/57 |
| 5,182,528 A | * | 1/1993 | Zuta | 331/1 A |
| 5,331,295 A | * | 7/1994 | Jelinek et al. | 331/57 |
| 5,515,012 A | * | 5/1996 | Bhushan et al. | 331/17 |
| 5,523,723 A | * | 6/1996 | Arcus et al. | 331/17 |
| 5,559,476 A | * | 9/1996 | Zhang et al. | 331/57 |
| 5,568,096 A | * | 10/1996 | Haartsen | 331/1 R |
| 5,646,968 A | * | 7/1997 | Kovacs et al. | 375/375 |
| 5,686,867 A | | 11/1997 | Sutardja et al. | 331/57 |
| 5,717,362 A | * | 2/1998 | Maneatis et al. | 331/57 |
| 5,936,460 A | * | 8/1999 | Iravani | 327/543 |
| 5,936,476 A | * | 8/1999 | Iravani | 331/57 |
| 5,963,098 A | | 10/1999 | MacMullen et al. | 331/1 |
| 5,963,101 A | * | 10/1999 | Iravani | 331/57 |
| 5,973,573 A | * | 10/1999 | Iravani et al. | 331/57 |
| 5,994,968 A | * | 11/1999 | Iravani et al. | 331/57 |
| 6,104,254 A | * | 8/2000 | Iravani | 331/57 |

* cited by examiner

Primary Examiner—David Mis
(74) Attorney, Agent, or Firm—Wagner, Murabito & Hao LLP

(57) ABSTRACT

A low phase noise CMOS voltage controlled oscillator (VCO) circuit. The VCO circuit includes a bias circuit and a VCO cell coupled to the bias circuit. The VCO cell includes a VCO output for transmitting a VCO output signal. A frequency to voltage converter is coupled to receive the VCO output signal. The frequency to voltage converter converts a frequency of the VCO output signal into a corresponding voltage output. The voltage output is coupled to control the bias circuit. The VCO cell includes a current source coupled to the bias circuit such that the voltage output from the voltage a current converter provides negative feedback to the VCO cell via the current source. The negative feedback, in turn, reduces the phase noise on the VCO output signal.

17 Claims, 8 Drawing Sheets

$$\text{Fout} = \frac{K_{VCO}}{1 + K_{VCO} \cdot K_{FMD}} \text{VCOin}$$

$$\text{Fout} \approx \frac{1}{K_{FMD}} \text{VCOin}$$

$K_{VCO}$ = VCO gain $K_{FMD}$ = FM detector gain

VCO CIRCUIT USING NEGATIVE FEEDBACK TO REDUCE PHASE NOISE

TECHNICAL FIELD

The present invention relates to the field CMOS technology voltage controlled oscillators. More particularly, the present invention relates to a high speed CMOS voltage controlled oscillator (VCO) for digital communications.

BACKGROUND ART

Voltage controlled oscillators (VCOs) are well known and widely used in the electronics industry. Within the digital communications field, VCOs are used in a variety of applications. Such applications include, for example, frequency synthesizers, signal generation, (e.g., serial transmission clock recovery) and the like. VCOs are typically designed to perform within a given set of boundary conditions and to perform according to a specified standard. Typical conditions include, for example, performance over operating temperature ranges, sensitivity to vibration, output sensitivity to interference, and the like. Typical performance standards include, for example, output signal frequency stability, output signal programmability, and the like.

A typical prior art VCO circuit generates an oscillating output signal having a specified frequency. The signal can have several different wave forms (e.g., square, saw tooth, triangular, etc.). The frequency of the output is tunable and is a function of an input voltage, an external resistance or capacitance, or the like. The type of application in which the VCO circuit is used dictates its operating conditions and performance requirements.

In addition, the type of application also largely determines type of fabrication technology used to manufacture the VCO. A large number of modern digital integrated circuits are fabricated using well known and widely used CMOS technology. Where the VCO circuit is included in a CMOS IC (integrated circuit), it is usually fabricated in CMOS (e.g., fabricated using CMOS process technology).

There is a problem, however, when the application in which the overall IC is used requires the VCO circuit to have an output with very low phase noise. For example, where the IC is part of a high speed serial transmission system (e.g., high speed wireless transmission systems) it is important that the output frequency of the VCO circuit be stable and jitter free, and be a consistent function of the control inputs (e.g., voltage, capacitance, and the like) while the output frequency exhibits extremely low phase noise.

For example, in a case where a prior art VCO circuit is used in an application for clock recovery in a gigabit serial transmission system, it is important that the output frequency remain stable and jitter free, and the output waveform remain within specified limits, even at the output frequencies of 1 GHz or more. The output frequency is used to reconstruct a serial transmission clock signal, which in turn, is used to sample data on a serial transmission line. Very little phase noise on the output signal can be tolerated. Distortion, defects, irregularity, or variation in the VCO output frequency or the waveform can have a very detrimental effect on the reconstructed clock signal, and hence, could lead to sampling errors, lost data, decreased throughput, or other such problems.

Consequently, for these very high performance applications it is important that the VCO circuit provide a very stable, jitter free output signal at the specified frequency, and that the output frequency exhibit as little phase noise is possible. However, prior art CMOS VCOs cannot reliably function at such high frequencies. Prior art CMOS VCOs cannot reliably generate output signals having an acceptable waveform (e.g., free of phase noise) and having acceptable stability.

Thus, what is required is a CMOS VCO circuit which solves the low phase noise operation problems of the prior art. What is required is a circuit capable of reliable operation at high frequencies while exhibiting very low phase noise on the output signal. What is required is a circuit which produces a stable, jitter free output signal with a waveform free of defects and irregularities. The present invention provides an advantageous solution to the above requirements.

DISCLOSURE OF THE INVENTION

The present invention provides a CMOS VCO circuit which solves the low phase noise operation problems of the prior art. The present invention provides a circuit capable of reliable operation at high frequencies while exhibiting very low phase noise on the output signal. The circuit of the present invention produces a stable, jitter free output signal with a waveform free of defects and irregularities.

In one embodiment, the present invention is implemented as a low phase noise CMOS voltage controlled oscillator (VCO) circuit. In this implementation, the VCO circuit includes a bias circuit and at least one VCO cell coupled to the bias circuit. The bias circuit is configured to produce a bias output. The VCO cell (or series of identical VCO cells) includes a VCO output for transmitting a VCO output signal. A frequency to voltage converter is coupled to receive the VCO output signal. The frequency to voltage converter converts a frequency of the VCO output signal into a corresponding voltage output. The voltage output is coupled to control the bias circuit. The VCO cell also includes a current source coupled to the bias circuit such that the voltage output from the voltage a current converter provides negative feedback to the VCO cell via the current source. The bias output from the bias circuit controls the amount of current flowing through the VCO cell, and thus, the frequency of the VCO output signal. The negative feedback, in turn, reduces the phase noise on the VCO output signal. In this manner, the VCO circuit produces a stable, jitter free VCO output signal with a waveform free of defects and irregularities.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the embodiments of the invention, a VCO circuit using negative feedback to reduce phase noise, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention provides a CMOS VCO circuit which solves the low phase noise operation problems of the prior art. The present invention provides a circuit capable of reliable operation at high frequencies while exhibiting very low phase noise on the output signal. The circuit of the present invention produces a stable, jitter free output signal with a waveform free of defects and irregularities. The present invention and its benefits are described in greater detail below.

Figure 1A:
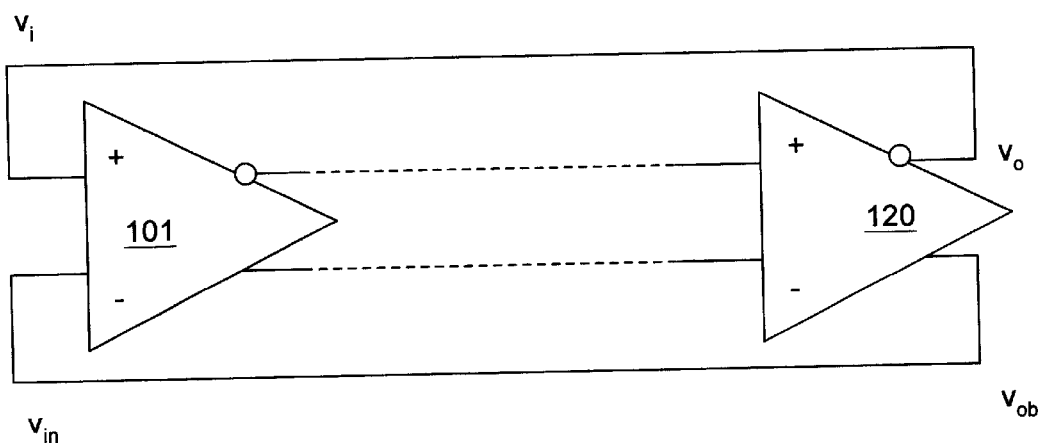
FIG. 1A shows a schematic block diagram of a VCO chain in accordance with one embodiment of the present invention.

FIG. 1A shows a block diagram of a VCO chain 100 in accordance with one embodiment of the present invention. VCO chain 100 provides a general overview of the oscillating elements which produce the output frequency of the present invention. VCO chain 100 is comprised of a plurality of inverters coupled to form a "chain" where the output of the first inverter is coupled to the input of the second inverter, and so on throughout the chain. Each inverter has a positive and a negative input and a corresponding positive and negative output. The first inverter, e.g., inverter 101 of VCO chain 100 has its outputs coupled to the inputs of the next inverter, and so on, until the last inverter 120 in the chain is coupled. The plurality of inverters between inverter 101 and 120 are represented by dotted lines. The outputs of the last inverter 120 are coupled to the inputs of the first inverter 101.

The resulting feed back effects an oscillation within VCO chain 100. The number of inverters included in VCO chain 100 largely determines the resulting natural frequency of oscillation and the total gain. The frequency of oscillation is variable over a range. The degree of variation is determined by the application of a control voltage to the circuitry comprising each inverter. Feedback to the inputs Vi and $Vi_n$ from the outputs Vo and Vob sustain the oscillation. The output signal of VCO chain 100 is typically taken from the outputs Vo and Vob of the last inverter, inverter 120, although the output signal could be taken from any of the inverters in the chain.

VCO chain 100 oscillates and maintains a stable, predictable, output signal at Vo and $Vo_b$ having a frequency which corresponds to an externally applied control voltage. The frequencies at outputs Vo and $Vo_b$ are substantially the same except for being opposite in phase. In the figures which follow (e.g., FIG. 1B), the outputs Vo and Vob are depicted as a single VCO output "fout".

Figure 1B:
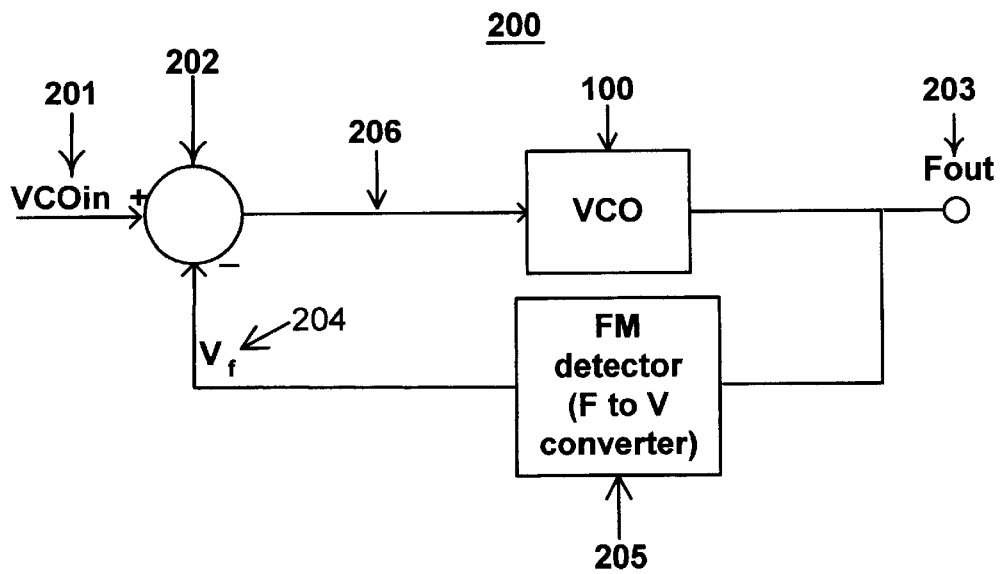
FIG. 1B an overview diagram of a VCO circuit in accordance with one embodiment of the present invention.

Referring now to FIG. 1B, an overview diagram of a VCO circuit 200 in accordance with one embodiment of the present invention is shown. As depicted in FIG. 1B, VCO circuit 200 includes VCO chain 100 from FIG. 1A. The output of VCO chain 100, fout 203, comprises the output signal of VCO circuit 200. A frequency to voltage converter 205 (e.g., implemented by a frequency modulation detector in the present embodiment) is coupled to receive fout 203. The frequency to voltage converter 205 functions by converting a frequency of fout 203 into a corresponding voltage output, Vf 204. The voltage level (e.g., the voltage magnitude) of Vf 204 various in accordance with the frequency of fout 203. Vf 204 is coupled to a bias circuit 202 as depicted, thereby providing negative feedback with respect to the input signal, VCOin 201. Bias circuit 202 functions by providing a bias output 206 to VCO chain 100. Bias output 206 controls the frequency of fout 203. Bias output 206 is, in turn, controlled by VCOin 201 and Vf 204.

In accordance with the present embodiment, VCO circuit 200 produces a low phase noise VCO output signal, Vf 204. As is well-known by those skilled in the art, phase noise on the VCO output signal typically manifests itself as jitter. In the present embodiment, the frequency to voltage converter 205 converts a frequency of the VCO output signal into a corresponding voltage output, which is in turn coupled to control the bias circuit 202. The bias output from the bias circuit controls the amount of current flowing through the VCO cell, and thus, the frequency of the VCO output signal. The negative feedback, in turn, reduces the phase noise on the VCO output signal. In this manner, the VCO circuit produces a stable, jitter free VCO output signal with a waveform free of defects and irregularities. The relationship between fout 203, VCOin 201, the shown by the equations of legend 210.

In the case where VCO circuit 200 is used to implement a phase locked loop (PLL), the amount of jitter present on the VCO output signal is a critical parameter and measure of performance of VCO circuit 200. The generation of jitter is mostly due to power supply noise or substrate noise. The power supply noise and/or substrate noise often induces phase noise at the output of the VCO, however, the negative feedback provided by a frequency to voltage converter 205 of VCO circuit 200 greatly reduces the phase noise at the VCO output, fout 203. The output of the frequency to voltage converter 205, Vf 204, is compared with VCOin 201 by bias circuit 202. The result, bias output 206, controls the oscillation frequency of VCO chain 100. Since the feedback provided by Vf 204 is negative, the feedback causes the frequency of fout 203 to be fairly constant, and correspondingly, causes the phase of the fout 203 to be fairly constant.

Figure 2:
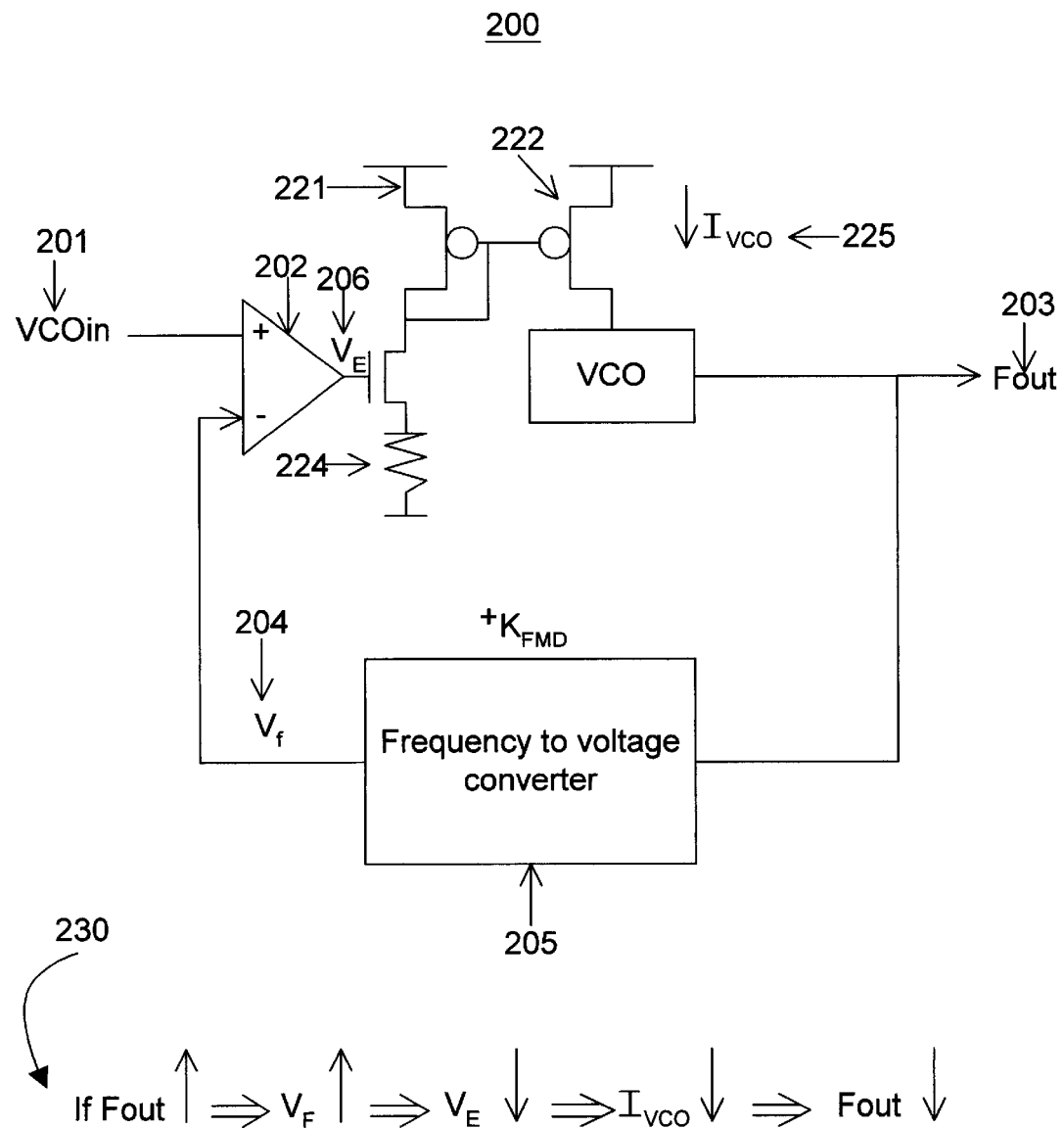
FIG. 2 shows a more detailed block diagram of a VCO circuit in accordance with one embodiment of the present invention.

Referring now to FIG. 2, a more detailed block diagram of a VCO circuit 200 in accordance with present invention is shown. FIG. 2 shows the output of bias circuit 202 coupled to a current source which provides current to VCO chain 100. The current source is comprised of transistors 221–223 and resistor 224. The bias output 206 controls the current flowing through transistor 221 and resistor 224. This current is mirrored by the current flowing through transistor 222, Ivco 225. Signal 225 is the current flowing through the VCO cells of VCO chain 100, and as such, directly controls their frequency of oscillation.

Hence, as depicted in FIG. 2, an increase in fout 203 causes a corresponding increase in Vf 204. As described above, this feedback is negative, enhance causes a decrease in signal 206 which causes a decrease in signal 225 and a corresponding decrease in fout 203. This relationship the shown in legend 230. As in FIG. 1B, the term "Kfmd" refers to the gain of the frequency to voltage converter.

Figure 3:
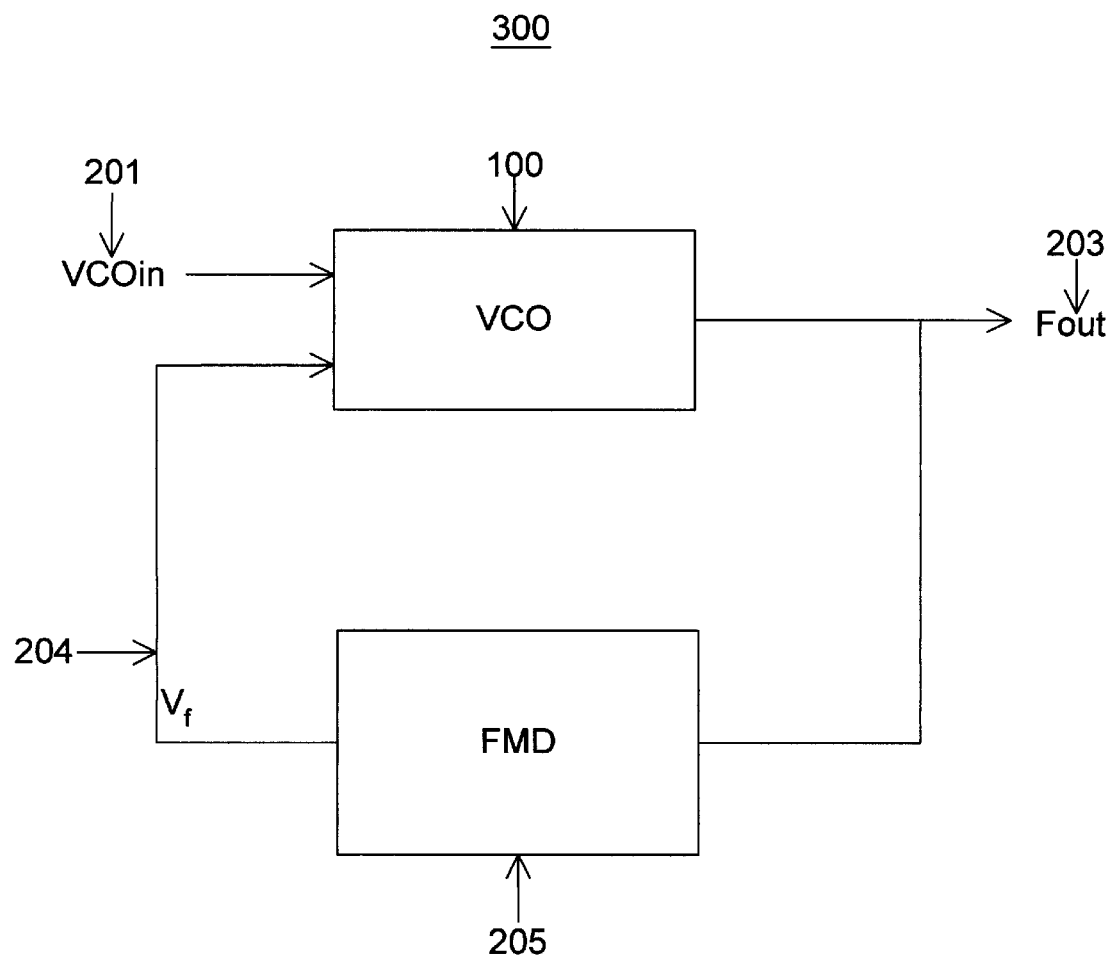
FIG. 3 shows an overview diagram of a VCO circuit in accordance with an alternative embodiment the present invention.

With reference now to FIG. 3, a VCO circuit 300 in accordance with an alternative embodiment of the present invention is shown. As with VCO circuit 200 of FIG. 2, VCO circuit 300 uses negative feedback from frequency to voltage converter 205 to produce a low phase noise output fout 203. However, as opposed to directly comparing the feedback of fout 203 with VCOin 201 using a bias circuit 202, VCO circuit 300 uses the feedback of fout 203 to directly control the resistance of the load transistors (e.g., implemented using differential transistor pairs) in each of the VCO cells of VCO chain 100. Hence, FIG. 3 shows Vf 204 being coupled directly to VCO chain 100.

Figure 4:
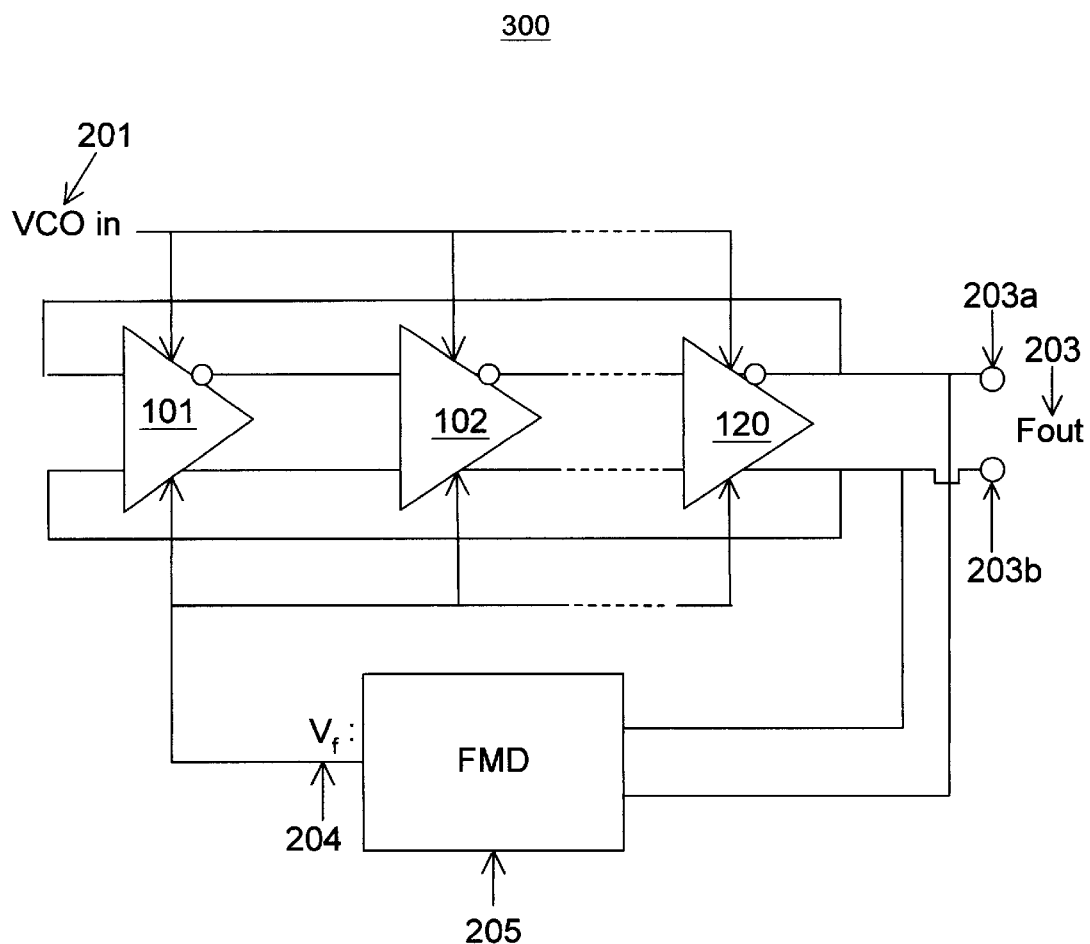
FIG. 4 shows a diagram of a VCO circuit in accordance with an alternative embodiment of the present invention in greater detail.

FIG. 4 shows VCO circuit 300 in accordance with one embodiment of the present invention in greater detail. As described above, VCO chain 100 includes a plurality of VCO cells 101–120 coupled in a chain. Outputs 203a and 203b both comprise output 203, fout 203. Vf 204 provides the negative feedback signal coupled to each of inverters 101–120. Fout 203 directly controls the resistance of the load transistors in each of inverters 101–120.

Figure 5:
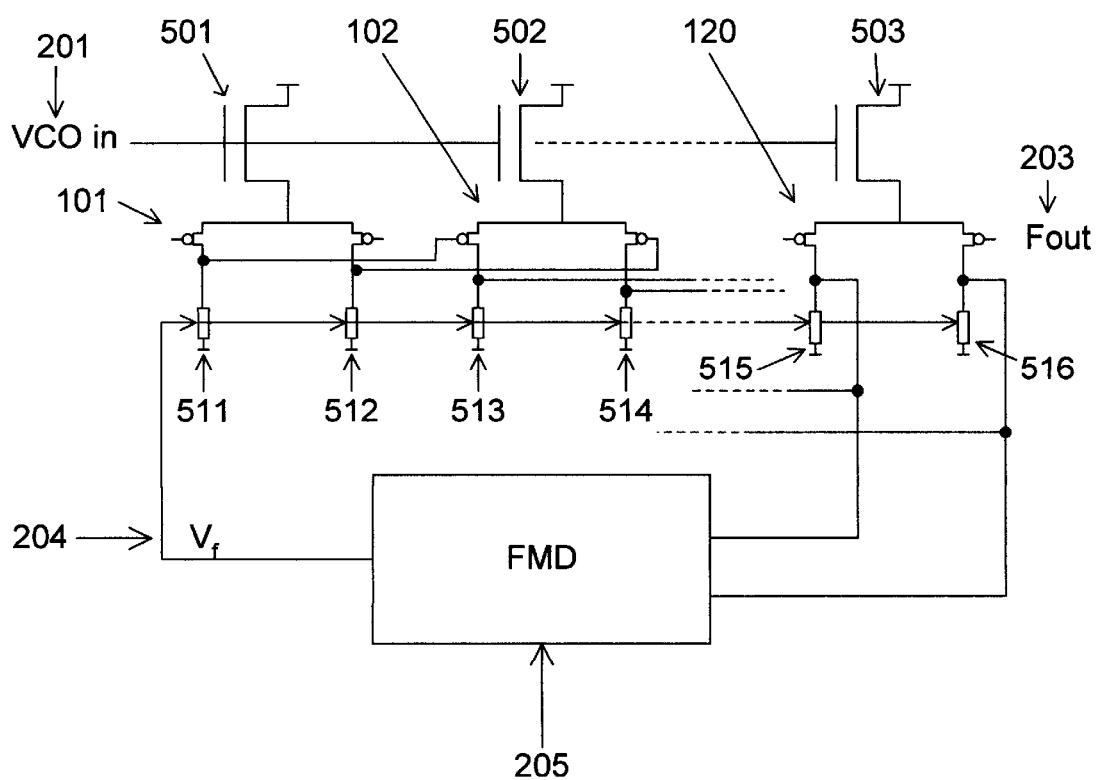
FIG. 5 shows a diagram of the load transistors of the VCO cells of the VCO circuit in accordance with the alternative embodiment the present invention.

FIG. 5 shows the load transistors 511–516 of VCO cells 101–120. FIG. 5 also shows current source transistors 501–503 respectively coupled to VCO cells 101–120. In this embodiment, instead of controlling a frequency of oscillation by controlling the amount of current flowing through current source transistors 501–503, Vf 204 controls the resistance of load transistors 511–516. This also controls the current flowing through each of VCO cells 101–120, and hence, the frequency of oscillation.

It should be noted that the configuration of VCO circuit 300 provides the advantage of eliminating any RC time constant introduced by the inclusion of a bias circuit (e.g., bias circuit 202 included in VCO circuit 200). Thus, for example, VCO circuit 300 is better suited to high-speed operation in comparison to VCO circuit 200.

Figure 6:
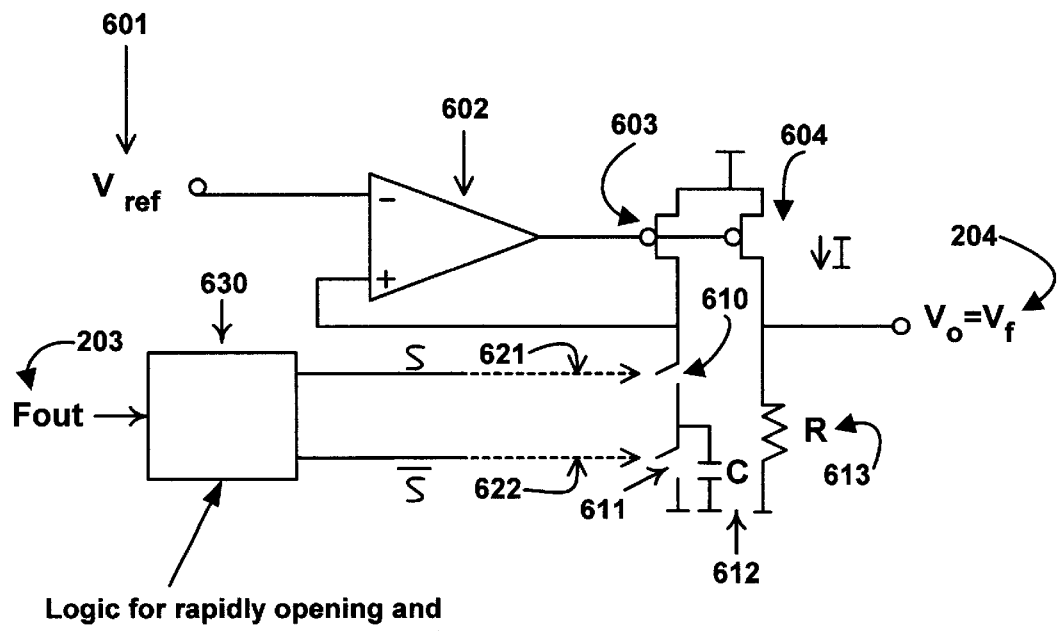
FIG. 6 shows a diagram of a frequency to voltage converter in accordance with one embodiment of the present invention.

Referring now to FIG. 6, a more detailed diagram of a frequency to voltage converter 205 in accordance with one embodiment of present invention is shown. As depicted in FIG. 6, frequency to voltage converter 205 of the present embodiment is implemented as a "switched capacitor resistor" circuit. The embodiment of the frequency to voltage converter 205 depicted in FIG. 6 can be used with both VCO circuit 300 (e.g., of FIG. 4) and VCO circuit 200 (e.g., of FIG. 2). The voltage level of Vf 204 is primarily produced by the action of switches 610 and 611 and capacitor 612. The frequency of fout 203 controls logic 630 to rapidly open and close switches 610 and 611. Hence, the rate at which switches 610 and 611 cycle determines the current flowing through transistor 603. Transistor 603 and transistor 604 are both biased by a comparator 602 receiving a reference signal, Vref 601. The current flowing through transistor 603 is mirrored by the current flowing through transistor 604, and Vf 204 is produced at the node between transistor 604 and resistor 613. The relationship between the current flowing through transistor 604 and Vf 204 is shown in the equations of legend 650.

Figure 7:
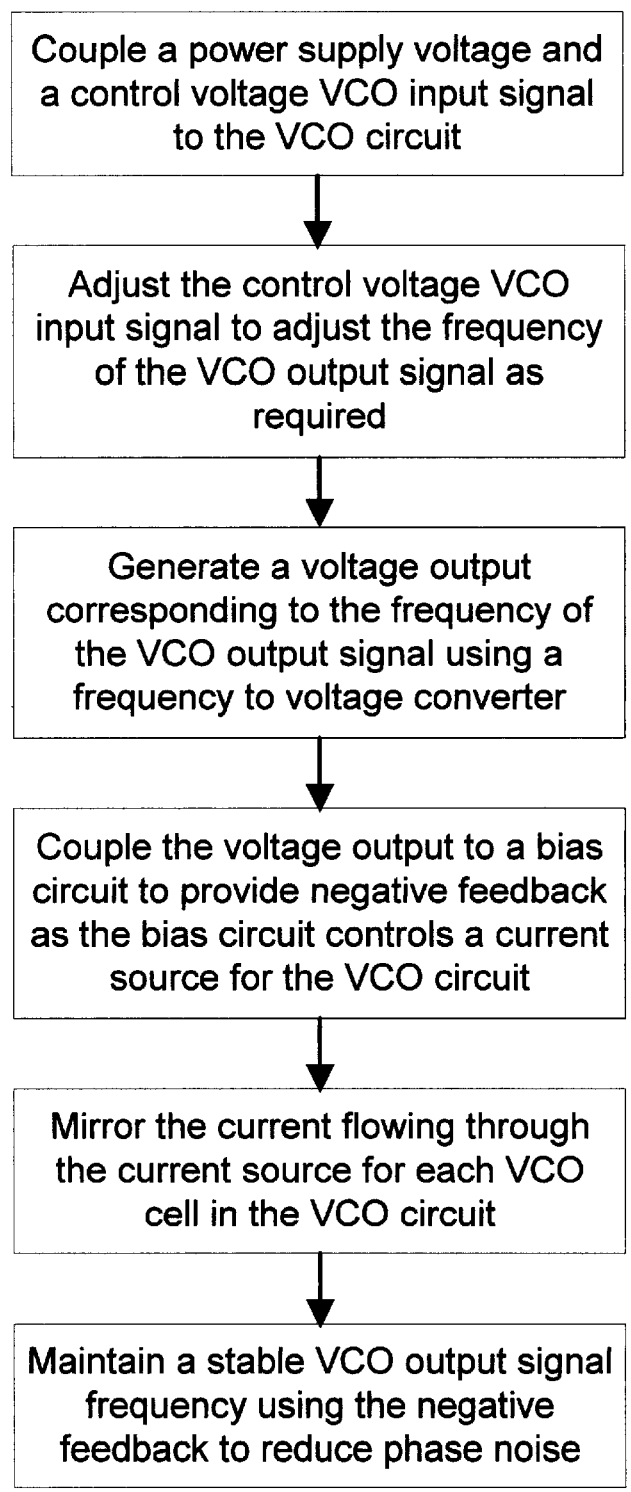
FIG. 7 shows a flow chart of the steps of a VCO circuit operating process in accordance with one embodiment of the present invention.

FIG. 7 shows a flow chart of the steps of an operating process 700 in accordance with one embodiment of the present invention. Process 700 begins in step 701, where a VCO circuit (e.g., VCO circuit 200 from FIG. 2) receives a power supply voltage Vdd and an initial VCO input signal VCOin. The current from Vdd sets up an internal oscillation and the voltage from VCOin sets the frequency of the oscillation.

In step 702, VCO circuit 200 receives an adjusted control voltage input (e.g., VCOin) from an external circuit. The adjusted control voltage input adjusts the frequency of oscillation within VCO circuit 200. The frequency of oscillation of VCO circuit 200 is variable in response to changes in the magnitude of the control voltage.

In step 703, a frequency to voltage converter (e.g., frequency to voltage converter 205) generates a voltage output responsive to the VCO output signal frequency. This voltage output changes in magnitude as fout changes in magnitude.

In step 704, the voltage output generated by the frequency to voltage converter is coupled to a bias circuit to provide negative feedback. As described above, in one embodiment, the bias circuit controls a current flowing through a current source coupled to the VCO. In an alternative embodiment, the bias circuit is coupled to directly control the resistance of the load transistors of the VCO cells. The output of the bias circuit is controlled by the VCOin signal, with negative feedback from the frequency to voltage converter.

In step 705, the current flowing through the current source coupled to the bias circuit is mirrored for each of the VCO cells of the VCO chain, for example, by using current mirror circuits coupled to each VCO cell.

In step 706, the VCO circuit in accordance with the present invention maintains a stable oscillating output signal having a very low phase noise. The output signal is stable over the output frequency range and has a waveform free of phase noise, jitter, and defects and/or anomalies.

Thus, the present invention provides a CMOS VCO circuit which solves the low phase noise operation problems of the prior art. The present invention provides a circuit capable of reliable operation at high frequencies while exhibiting very low phase noise on the output signal. The circuit of the present invention produces a stable, jitter free output signal with a waveform free of defects and irregularities.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A low phase noise CMOS voltage controlled oscillator (VCO) circuit, comprising:

a bias circuit;

a VCO cell coupled to said bias circuit;

a VCO output for transmitting a VCO output signal; and a frequency to voltage converter for converting a frequency of said VCO output signal into a corresponding voltage output, said frequency to voltage converter including a frequency modulation detector circuit to convert the frequency of the VCO output signal to the corresponding voltage output, said frequency modulation detector circuit implemented using a switched capacitor resistor circuit, said voltage output coupled to control said bias circuit; and said VCO cell having a current source coupled to said bias circuit such that said voltage output provides negative feedback to said VCO cell via said current source, reducing phase noise on said VCO output signal.

2. The circuit of claim 1, wherein said voltage controlled oscillator circuit is fabricated using CMOS technology.

3. The circuit of claim 1, wherein the VCO circuit includes a VCO chain having a plurality of VCO cells for generating said VCO output signal.

4. The circuit of claim 3, wherein the VCO circuit includes a plurality of current sources respectively coupled to the plurality of VCO cells, the plurality of current sources coupled to receive a bias output from the bias circuit to control current flowing through the VCO cells.

5. The circuit of claim 1 wherein the frequency to voltage converter includes a switched capacitor resistor circuit to convert the frequency of the VCO output signal into the corresponding output voltage.

6. The circuit of claim 1, wherein the bias circuit includes a comparator coupled to receive a VCO input signal from an external circuit and the corresponding voltage output from the frequency to voltage converter, the bias circuit configured to produce a bias output corresponding to the VCO input signal with negative feedback provided by the corresponding output voltage.

7. The circuit of claim 6, wherein the bias circuit is configured such that the negative feedback provided by the corresponding output voltage from the frequency to voltage converter controls the bias output coupled to the current source in order to reduce phase noise on the VCO output signal.

8. A low phase noise CMOS voltage controlled oscillator (VCO) circuit, comprising:

a plurality of VCO cells coupled to form a VCO chain;

a plurality of corresponding load transistors respectively included in the VCO cells;

a VCO output for transmitting a VCO output signal; and a frequency to voltage converter for converting a frequency of said VCO output signal into a corresponding voltage output, said voltage output coupled to control a resistance of the load transistors in the VCO cells;

said load transistors coupled to receive the corresponding voltage output such that the voltage output provides negative feedback to said VCO cells via said load transistors, reducing phase noise on said VCO output signal, wherein said frequency to voltage converter includes a switched capacitor resistor circuit to convert the frequency of said VCO output signal into the corresponding output voltage.

9. The circuit of claim 8, wherein said voltage controlled oscillator circuit is fabricated using CMOS technology.

10. The circuit of claim 8, wherein the frequency to voltage converter is implemented using a frequency modulation detector circuit to convert the frequency of the VCO output signal to the corresponding voltage output.

11. The circuit of claim 8, wherein the load transistors are configured such that the negative feedback provided by the corresponding output voltage from the frequency to voltage converter controls the current flowing through the VCO cells in order to reduce phase noise on the VCO output signal.

12. The circuit of claim 8, wherein the load transistors are configured such that the negative feedback provided by the corresponding output voltage from the frequency to voltage converter controls the current flowing through the VCO cells in order to reduce jitter induced by power supply noise.

13. The circuit of claim 8, wherein the load transistors are configured such that the negative feedback provided by the corresponding output voltage from the frequency to voltage converter controls the current flowing through the VCO cells in order to reduce jitter induced by substrate noise.

14. In a CMOS voltage controlled oscillator (VCO) circuit, a method for producing a low phase noise VCO output signal, the method comprising the steps of:

a) generating a VCO output signal using a VCO chain of VCO cells;

b) generating a bias signal using a bias circuit coupled to the VCO chain;

c) converting a frequency of the VCO output signal into a corresponding voltage output, the converting performed by a frequency to voltage converter coupled to said VCO chain, wherein the frequency to voltage converter includes a switched capacitor resistor circuit to convert the frequency of the VCO output signal into the corresponding output voltage;

d) providing negative feedback to the bias circuit; and e) controlling the VCO cell via a current source coupled to receive the bias signal, wherein the negative feedback provided by the corresponding voltage output reduces phase noise on the VCO output signal.

15. The method of claim 14, wherein said voltage controlled oscillator circuit is fabricated using CMOS technology.

16. The method of claim 14, wherein the frequency to voltage converter is implemented using a frequency modulation detector circuit to convert the frequency of the VCO output signal to the corresponding voltage output.

17. The method of claim 14, wherein the bias circuit includes a comparator coupled to receive a VCO input signal from an external circuit and the corresponding voltage output from the frequency to voltage converter, the bias circuit configured to produce a bias output corresponding to the VCO input signal with negative feedback provided by the corresponding output voltage.

* * * * *